(12) United States Patent
Hori et al.

(10) Patent No.: US 8,873,611 B2
(45) Date of Patent: Oct. 28, 2014

(54) TRANSMITTER, CONTROL METHOD, COMPUTER PROGRAM AND DELTA-SIGMA MODULATOR

(75) Inventors: Shinichi Hori, Tokyo (JP); Toshio Hayashi, Tokyo (JP); Daisuke Nagai, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 13/821,877

(22) PCT Filed: Sep. 2, 2011

(86) PCT No.: PCT/JP2011/070542
§ 371 (c)(1),
(2), (4) Date: Mar. 8, 2013

(87) PCT Pub. No.: WO2012/033182
PCT Pub. Date: Mar. 15, 2012

(65) Prior Publication Data
US 2013/0177062 A1    Jul. 11, 2013

(30) Foreign Application Priority Data

Sep. 10, 2010 (JP) .................. 2010-202725

(51) Int. Cl.
*H04B 3/46* (2006.01)
*H04B 1/04* (2006.01)
*H03M 3/00* (2006.01)

(52) U.S. Cl.
CPC ............ *H04B 1/0475* (2013.01); *H03M 3/392* (2013.01); *H03M 3/41* (2013.01); *H03M 3/368* (2013.01)

USPC ........................................................ 375/227

(58) Field of Classification Search
CPC ....... H03M 3/392; H03M 3/41; H03M 3/368; H04B 1/0475
USPC ........................................................ 375/227
See application file for complete search history.

(56) References Cited

U.S. PATENT DOCUMENTS

| 5,010,347 | A | * | 4/1991 | Yukawa .................... 341/143 |
| 5,243,345 | A | * | 9/1993 | Naus et al. ................ 341/143 |
| 5,952,947 | A | * | 9/1999 | Nussbaum et al. .......... 341/143 |
| 6,057,794 | A | * | 5/2000 | Takamuki ................. 341/143 |
| 6,147,631 | A | * | 11/2000 | Maulik et al. ............. 341/122 |
| 6,232,901 | B1 | * | 5/2001 | Abbey .................... 341/143 |

(Continued)

FOREIGN PATENT DOCUMENTS

| JP | 3-76318 A | 4/1991 |
| JP | 11-027151 A | 1/1999 |

(Continued)

OTHER PUBLICATIONS

A. Frappé et al., "A digital ΔΣ RF signal generator for mobile communication transmitters in 90 nm CMOS", 2008 IEEE Radio Frequency Integrated Circuits Symposium, pp. 13-16, 2008.

(Continued)

*Primary Examiner* — Juan A Torres
(74) *Attorney, Agent, or Firm* — Sughrue Mion, PLLC

(57) ABSTRACT

In order to improve radio characteristic in a transmitter, there are included a ΔΣ modulation means that ΔΣ modulates a given input signal; and a control means that changes parameters of the ΔΣ modulation means in accordance with a given condition.

7 Claims, 11 Drawing Sheets

(56) References Cited

U.S. PATENT DOCUMENTS

| | | | |
|---|---|---|---|
| 7,504,976 B1* | 3/2009 | Pellon | 341/143 |
| 2004/0233091 A1* | 11/2004 | Clement et al. | 341/155 |
| 2005/0163232 A1* | 7/2005 | Norsworthy et al. | 375/247 |
| 2007/0211821 A1 | 9/2007 | Haque et al. | |
| 2008/0031381 A1 | 2/2008 | Matsuura et al. | |
| 2008/0068240 A1 | 3/2008 | Matsuura | |
| 2008/0309530 A1* | 12/2008 | Baker | 341/136 |
| 2009/0066549 A1* | 3/2009 | Thomsen et al. | 341/143 |
| 2010/0309803 A1* | 12/2010 | Toh et al. | 370/252 |

FOREIGN PATENT DOCUMENTS

| | | |
|---|---|---|
| JP | 2001-308746 A | 11/2001 |
| JP | 2008-104160 A | 5/2008 |
| JP | 2009-530914 A | 8/2009 |
| JP | 2010-045726 A | 2/2010 |
| JP | 2010-081299 A | 4/2010 |
| JP | 2010-081299 A5 | 9/2011 |
| WO | 2008/015970 A1 | 2/2008 |

OTHER PUBLICATIONS

Y. Wang, "An improved Kahn transmitter architecture based on Delta-Sigma modulation", Microwave Symposium Digest, 2003 IEEE MTT-S International, vol. 2, pp. 1327-1330, 2003.

A. Dupuy et al., "High efficiency power transmitter based on envelope Delta-Sigma modulation (EDSM)", IEEE Vehicular Technology Conference, 2004, VTC2004-Fall, 2004 IEEE 60th, vol. 3, pp. 2092-2095, 2004.

* cited by examiner (a) TWO-LEVEL QUANTIZER OUTPUT (b) THREE-LEVEL QUANTIZER OUTPUT (c) FOUR-LEVEL QUANTIZER OUTPUT (a) CONTROL SIGNAL (b) PHONE CALL/DATA TRANSMISSION

TRANSMITTER, CONTROL METHOD, COMPUTER PROGRAM AND DELTA-SIGMA MODULATOR

CROSS-REFERENCE TO RELATED APPLICATIONS

This application is based upon and claims the benefit of priority from Japanese Patent Application 2010-202725 filed on Sep. 10, 2010, the disclosure of which is incorporated herein in its entirety by reference.

TECHNICAL FIELD

The present invention relates to a transmitter, a control method, a computer program and a $\Delta$-$\Sigma$ modulator.

BACKGROUND ART

In recent years, an increase in an efficiency of a signal amplifier in a transmitter of a wireless communication device is required. A class-D amplifier using switching operation is a useful amplifier whose amplification efficiency is theoretically 100 percent. As a transmitter using such a class-D amplifier, mentioned are a configuration using IF-DSM (Intermediate Frequency-Delta Sigma Modulation) and that using EDSM (Envelope Delta Sigma Modulation). A configuration of a transmitter using IF-DSM is described, for example, in non-patent document 1 (A. Frappe, B. Stefanelli, A. Flament, A. Kaiser and A. Cathelin, "A digital $\Delta$-$\Sigma$ RF signal generator for mobile communication transmitters in 90 nm CMOS", IEEE RFIC Symp., pp. 13-16, June 2008). A configuration of a transmitter using EDSM is described, for example, in non-patent document 2 (Y. Wang, "An improved Kahn transmitter architecture based on delta-sigma modulation", IEEE Microwave Symposium Digest, Vol. 2, pp. 1327-1330, June, 2003) and non-patent document 3 (Dupuy A. and Y. Wang, "High efficiency power transmitter based on envelope delta-sigma modulation (EDSM)", IEEE Vehicular Technology Conference, Vol. 3, pp. 2092-2095, September, 2004).

FIG. 1 is a block diagram showing an example of the configuration of the transmitter using IF-DSM. The transmitter performs $\Delta$-$\Sigma$ (delta-sigma) modulation of an orthogonal radio signal (IQ radio signal) generated at a digital baseband, and subsequently generates an RF (Radio Frequency) band radio signal by means of digital IQ modulation.

FIG. 2 is a block diagram showing an example of the configuration of the transmitter 100 using EDSM. The transmitter generates an amplitude signal and a phase signal separately from an IQ radio signal generated at a digital baseband, and subsequently, after performing $\Delta$-$\Sigma$ modulation of the amplitude signal, generates an RF-band radio signal by multiplying the modulated amplitude signal by the phase signal. Specifically, first, a signal to be modulated is split into upper and lower branches by a splitter 103. In the upper branch, an envelope detector 101 extracts amplitude information from the signal to be modulated, and inputs it to a $\Delta$-$\Sigma$ modulator 102. The $\Delta$-$\Sigma$ modulator 102 converts the amplitude information into a rectangular signal. On the other hand, in the lower branch, a comparator 104 generates a phase signal by processing the signal to be modulated into a rectangular signal. The phase signal undergoes delay adjustment by a delay adjuster 105 so that its timing is coincident with that of an output signal from the $\Delta$-$\Sigma$ modulator 102 in the upper branch. The rectangular signal including amplitude information outputted from the upper branch and the rectangle signal including phase information outputted from the lower branch after the delay adjustment are mixed by a mixer 106, and thus are converted into a rectangular radio signal. Here, the rectangular radio signal includes, in addition to a desired signal, quantization noise arising in the process for obtaining a rectangular signal. The rectangular radio signal is amplified by a signal amplifier 107, subsequently undergoes suppression of its unnecessary quantization noise by an output filter 108, and finally becomes a transmission signal radiated from an antenna. Here, the signal amplifier 107 is assumed to be an amplifier with switching operation such as a class-D one, but may also be connected with a signal amplifier without switching operation such as class-A or class-AB one.

Hereinafter, description will be given for the $\Delta$-$\Sigma$ modulator. Although the $\Delta$-$\Sigma$ modulator may have various circuit configurations depending on its order and the like, a first-order $\Delta$-$\Sigma$ modulator with 1-bit output is taken as an example in the following description. FIG. 3 is a circuit configuration diagram of the first-order $\Delta$-$\Sigma$ modulator. If the z-transforms of input and output signals of the $\Delta$-$\Sigma$ modulator are represented by $X(z)$ and $Y(z)$, and that of the quantization noise arising in a quantizer by $N(z)$, the following equation stands.

$$Y(z) = \frac{\alpha}{1+(\alpha\beta-1)z^{-1}}X(z) + \frac{1-z^{-1}}{1+(\alpha\beta-1)z^{-1}}N(z) \qquad \text{(equation 1)}$$

In the right hand side of the equation 1, a coefficient of $X(z)$ is a signal transfer function, and that of $N(z)$ is a noise transfer function. As the equation 1 shows, the signal transfer function and the noise transfer function depend on multiplication coefficients, $\alpha$ and $\beta$ of a multiplier. Although it is not shown in the equation 1, the noise transfer function is also influenced by parameters of the quantizer, which will be described below.

The $\Delta$-$\Sigma$ modulator starts operation by being triggered by a rising edge or a decaying edge, or the both, in a signal in toggle operation. Here, a temporal interval between adjacent edges triggering the $\Delta$-$\Sigma$ modulator operation is not limited to a constant period, and may be inconstant.

An adder performs addition or subtraction between two pieces of input data. The multiplier multiplies input data by the multiplication coefficients ($\alpha$, $\beta$). A delay device delays the input data by a time period equivalent to a single one of the above-described interval between adjacent edges in a signal in the toggle operation triggering the $\Delta$-$\Sigma$ modulator operation. From the delaying operation, it can be referred to also as a storage element storing a single piece of input data. The quantizer quantizes input data with reference to a threshold value. The quantizer has two kinds of parameters: a threshold value and output values.

FIGS. 4(a)-(c) show relational diagrams between a threshold value and input-output values of the quantizer constituting the $\Delta$-$\Sigma$ modulator. As shown in FIG. 4 (a), in the case the output of the quantizer has two levels, with reference to a single threshold value (0, for example), input values are classified corresponding to two output values (+1 and -1, for example). In this case, the output value becomes +1, if an input value of the quantizer is equal to or larger than 0, and becomes -1, if an input value is negative.

As shown in FIG. 4 (b), in the case the output of the quantizer has three levels, with reference to two threshold values (+0.5 and -0.5, for example), input values are classified corresponding to three output values (+1, 0 and -1, for example). In this case, the output value becomes +1, if an input value of the quantizer is equal to or larger than +0.5, becomes 0, if an input value is equal to or larger than −0.5 and smaller than +0.5, and becomes −1, if an input value is smaller than −0.5.

As shown in FIG. 4 (c), in the case the output of the quantizer has four levels, with reference to three threshold values (+0.25, 0 and −0.25, for example), input values are classified corresponding to four output values (+1, 0.5, −0.5 and −1, for example). In this case, the output value becomes +1, if an input value of the quantizer is equal to or larger than +0.25, becomes +0.5, if an input value is equal to or larger than 0 and smaller than +0.25, becomes −0.5, if an input value is equal to or larger than −0.25 and smaller than 0, and becomes −1, if an input value is smaller than −0.25.

Further, signal and noise transfer functions of the Δ-Σ modulator are influenced by, in addition to the parameters of the quantizer (threshold values and output values) and multiplication coefficients ($\alpha$, $\beta$), the order of the Δ-Σ modulator. The transfer functions are closely related to ACPR (Adjacent Channel leakage Power Ratio), which is one of essential standards concerning radio characteristics of a transmitter.

Specifically, a shape in shaping of the quantization noise that determines ACPR is dependent on the order and multiplication coefficients of a Δ-Σ modulator and the number of output bits of the quantizer. Generally, if the order increases, the degree of freedom of the shape in the shaping increases, and noise in the vicinity of a transmission signal band can thus be reduced. Further, if the number of the bits increases, electrical power of the whole quantization noise can be reduced. That is, by increasing the order or the number of the bits, the ACPR can be improved resultantly.

DISCLOSURE OF INVENTION

Technical Problem

As described above, the signal and noise transfer functions of the Δ-Σ modulator are determined by parameters of the Δ-Σ modulator. However, it is not easy to change instantaneously the order of the Δ-Σ modulator or the number of its output bits. In particular, increase in the number of output bits results in increase in the kinds of bias voltages of an amplifier circuit. For this reason, in practical device design, each of parameters such as the order and the number of bits is usually set at a fixed value.

However, when the parameters are fixed, the transfer functions are limited to a certain one. If the transfer functions are fixed to be a certain one, because it is impossible for the Δ-Σ modulator to adapt to various types of transmission signals, change of a temporal waveform depending on modulation methods, temporal change in transmission power or the like, and hence an optimal ACPR is not always obtained, there exists a situation where deterioration in radio characteristics has to be accepted.

The object of the present invention is to provide a transmitter, a control method, a computer program and a Δ-Σ modulator, which can improve radio characteristics of a transmitter.

Solution to Problem

In order to realize the above-described object, a transmitter of the present invention comprises a Δ-Σ modulation means which performs Δ-Σ modulation of a predetermined input signal, and a control means which changes a parameter of the Δ-Σ modulation means in accordance with a predetermined condition.

A control method of the present invention is a control method of a Δ-Σ modulator which performs Δ-Σ modulation of a predetermined input signal, wherein a parameter of the Δ-Σ modulator is changed in accordance with a predetermined condition.

A computer program of the present invention causes a computer of a transmitter comprising a Δ-Σ modulator which performs Δ-Σ modulation of a predetermined input signal to execute a process of changing a parameter of the Δ-Σ modulator in accordance with a predetermined condition.

A Δ-Σ modulator of the present invention comprises a Δ-Σ modulation means which performs Δ-Σ modulation of a predetermined input signal and a control means which changes a parameter of the Δ-Σ modulation means in accordance with a predetermined condition.

Advantageous Effect of Invention

According to the present invention, it is possible to improve radio characteristics of a transmitter.

DESCRIPTION OF EMBODIMENTS

Exemplary embodiments for implementing the present invention will be described below, with reference to drawings. Here, the exemplary embodiments are shown as examples, and the present invention is not limited to the configurations of the following exemplary embodiments.

First Exemplary Embodiment

Figure 2:
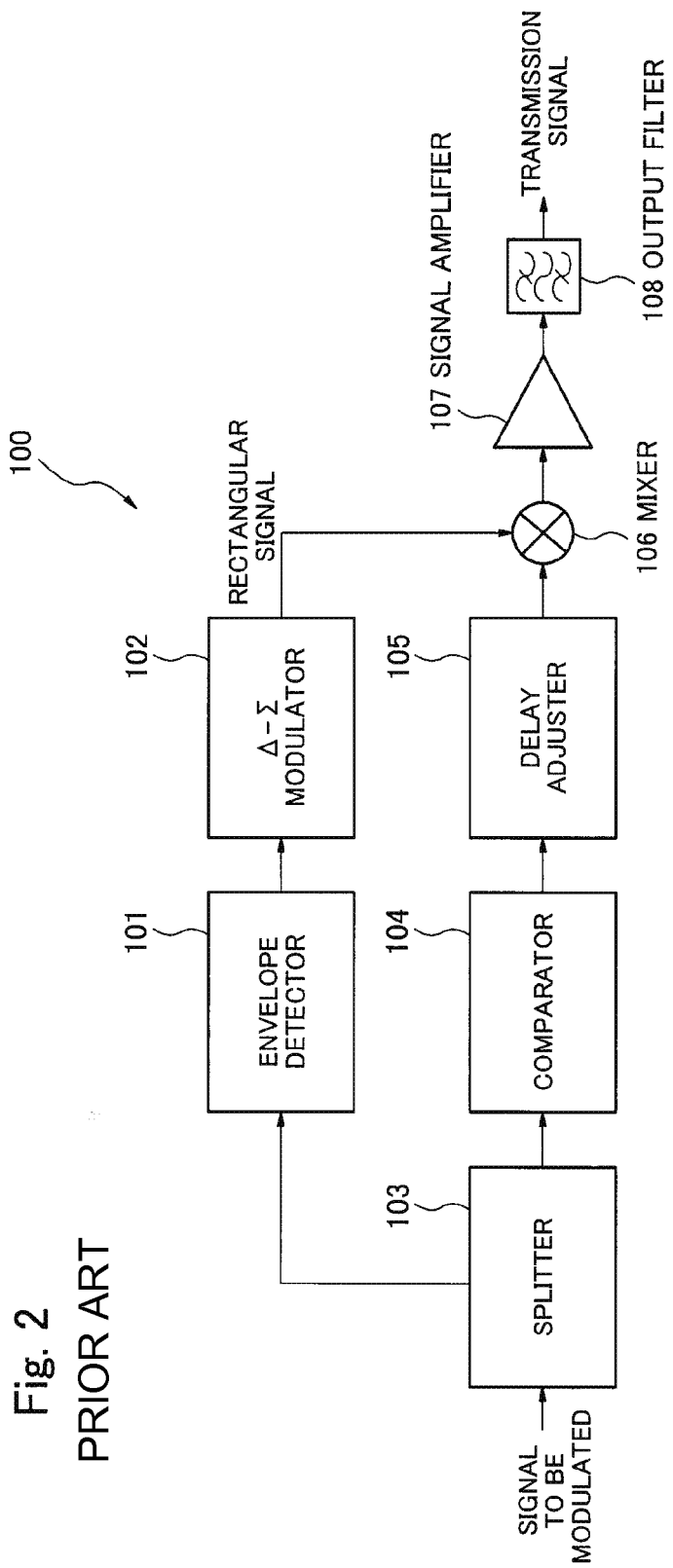
FIG. 2 A block diagram showing an example of a configuration of a transmitter using EDSM.
Figure 5:
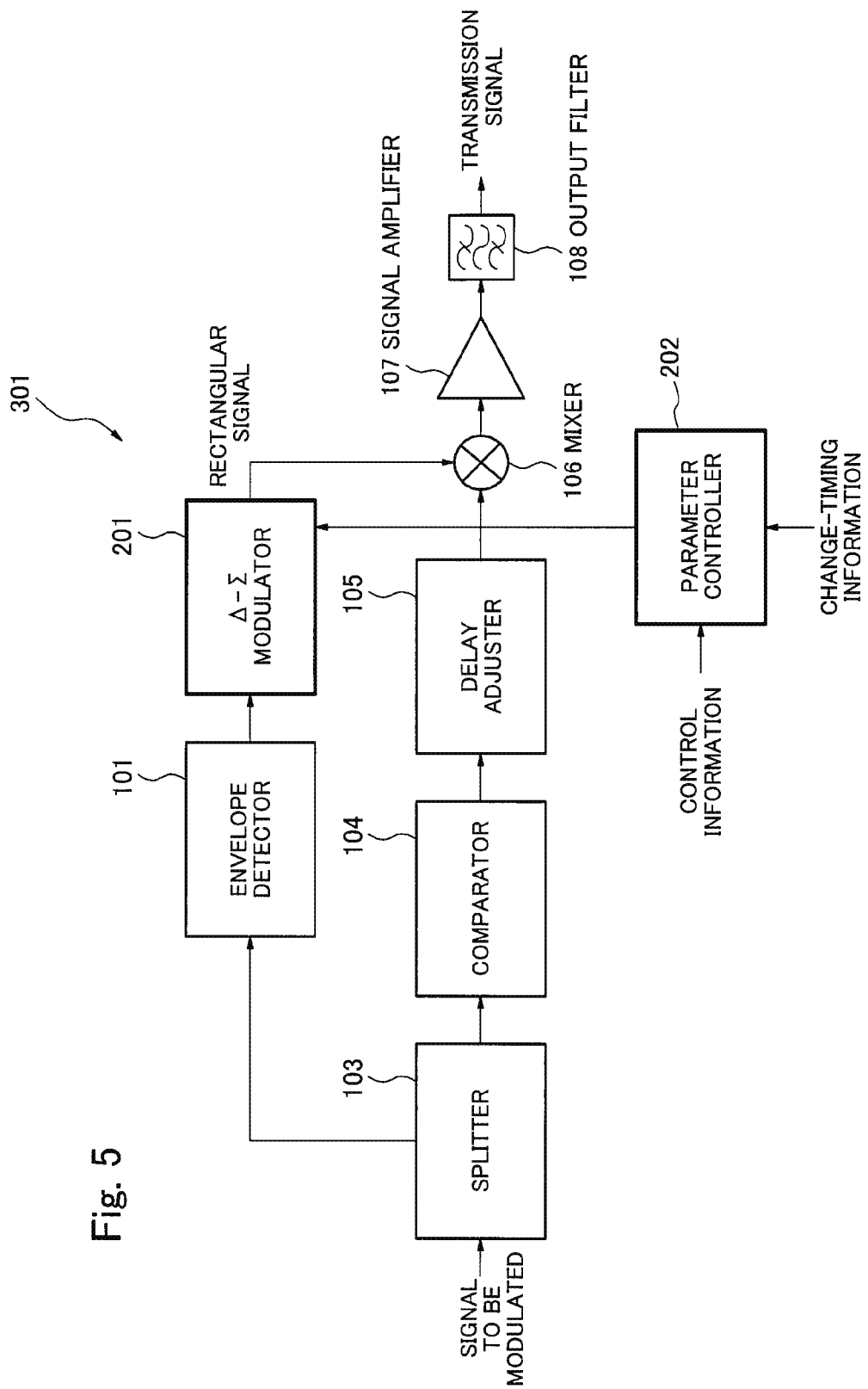
FIG. 5 A block diagram showing an example of a configuration of a transmitter according to a first exemplary embodiment of the present invention.

FIG. 5 is a block diagram showing an example of a configuration of a transmitter 301 according to a first exemplary embodiment of the present invention. This transmitter 301 is a transmitter using EDSM similarly to that in FIG. 2. The difference of the transmitter 301 from the transmitter 100 shown in FIG. 2 is in that the Δ-Σ modulator 102 is replaced by a Δ-Σ modulator 201, and further, a parameter controller 202 (control means) is added. In contrast to that the Δ-Σ modulator 102 operates with fixed parameters, the Δ-Σ modulator 201 is compatible with parameter-varying control. That is, the Δ-Σ modulator 201 can perform a Δ-Σ modulation process on the basis of parameters inputted from the parameter controller 202. The parameter controller 202 changes parameters of the Δ-Σ modulator 201 (for example, multiplication coefficients, and a threshold value and/or output values of a quantizer), on the basis of external control signals (for example, control information and change-timing information) inputted from an external device such as an upper level device.

Here, functions and connections of the other components provided in the transmitter 301 (an envelope detector 101, a splitter 103, a comparator 104, a delay adjuster 105, a mixer 106, a signal amplifier 107 and an output filter 108) are respectively the same as those of the transmitter 100 shown in FIG. 2. Therefore, their descriptions will be omitted. Further, in this case, a case of the Δ-Σ modulator 201 being a first-order Δ-Σ modulator is taken as an example, and the configuration of the Δ-Σ modulator 201 is assumed to be equivalent to that in FIG. 3 (however, the parameters are not fixed, and the modulation process can be performed on the basis of inputted parameters).

Figure 6:
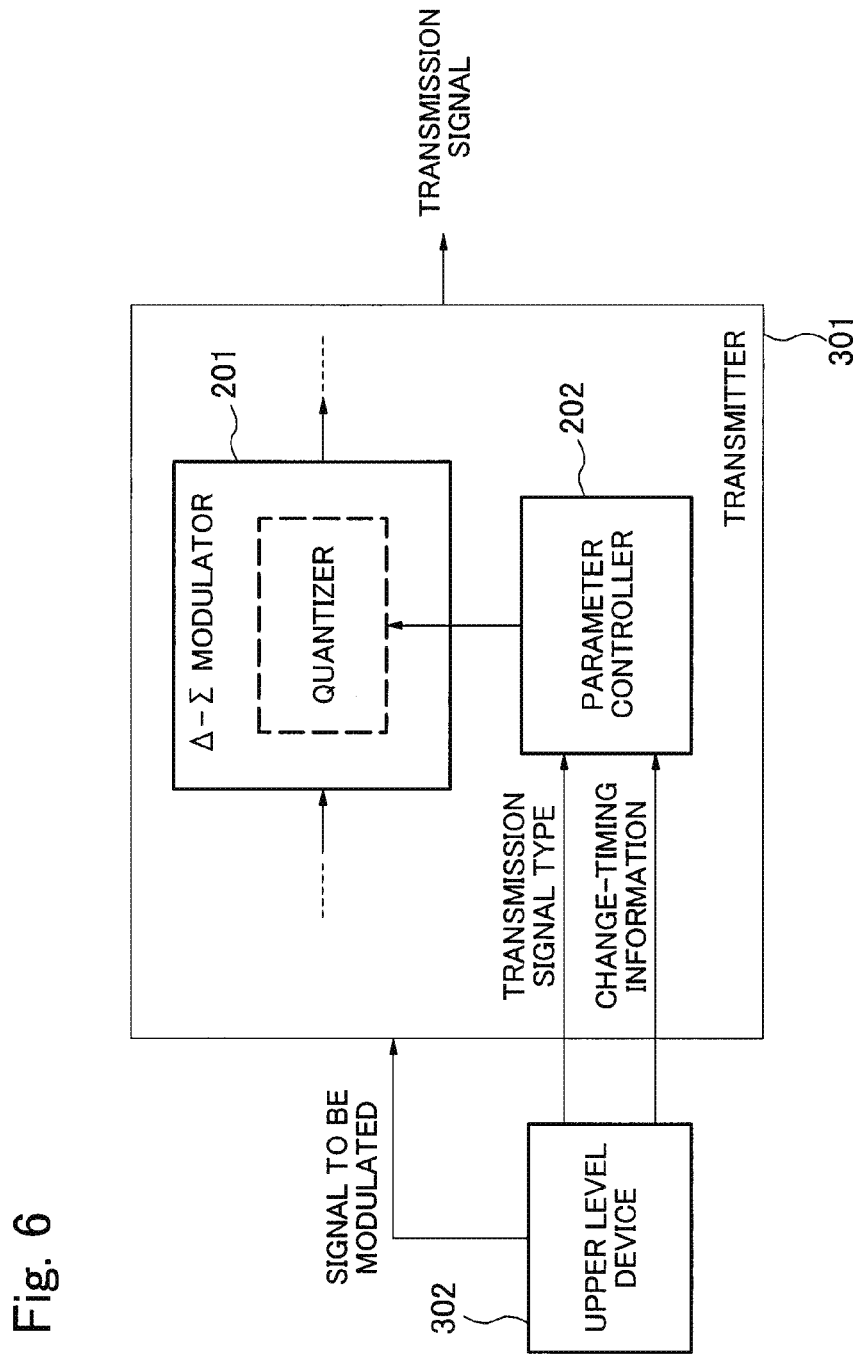
FIG. 6 A diagram for illustrating operation of the transmitter shown in FIG. 5 (a partial block diagram showing only components related directly to parameter control).

Next, operation of the transmitter 301 will be described. FIG. 6 is a diagram for illustrating operation of the transmitter 301 shown in FIG. 5. In FIG. 6, shown is only a configuration related directly to parameter control which is characteristic to the present exemplary embodiment, and the other components with no direct relation to the parameter control are omitted. Further, because the following description will be given taking as an example a case where the parameters of a quantizer of the Δ-Σ modulator 201 are changed, a quantizer shown in FIG. 6 is only that of the Δ-Σ modulator 201. As described above, the parameter controller 202 changes the parameters of the Δ-Σ modulator 201 on the basis of "control information" and "change-timing information" inputted from an upper level device or the like. With respect to the "control information", in the following description, a case of "transmission signal type" is taken as an example.

An upper level device 302 identifies the type of a transmission signal and, at the time when a change is necessary, notifies the parameter controller 202 of the transmission signal type (which is an example of control information) and change-timing information. Table 1 shows relationships between the transmission signal types (conditions) and the parameters of the Δ-Σ modulator 201.

TABLE 1

Example of Δ-Σ modulator parameters for each condition

| | multiplication coefficients (α, β) | quantizer threshold value | quantizer output | transmission signal type |
|---|---|---|---|---|
| condition 1 | 1.0 | ±0.25, 0 | ±1.0, ±0.5 | control signal |
| condition 2 | same as above | ±0.125, 0 | same as above | phone call/data transmission |

Figure 4:
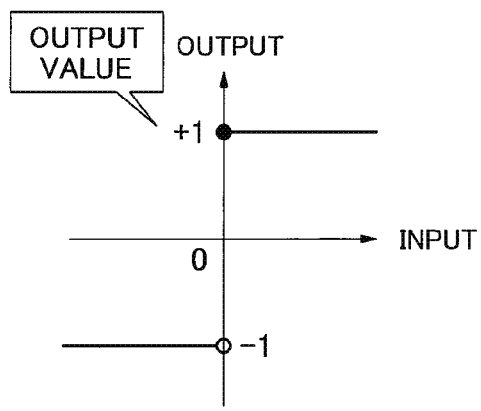
FIG. 4 Relational diagrams between threshold values and input-output values of a quantizer constituting a Δ-Σ modulator are shown, specifically, (a) shows a relational diagram for the case the output of a quantizer has two levels, (b) for the case of three levels, and (c) for the case of four levels.
Figure 4:
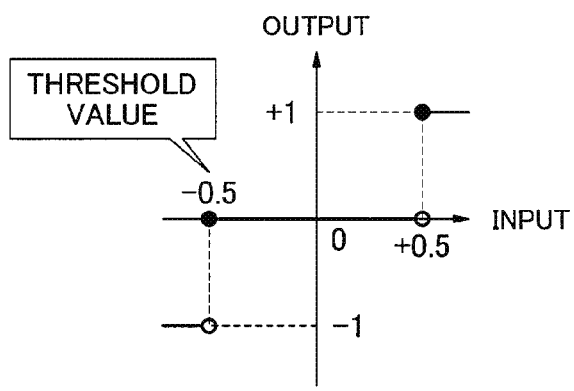
Figure 4:
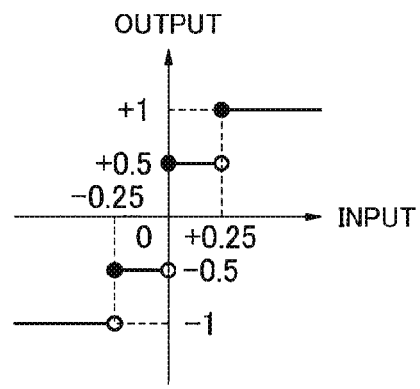

In Table 1, a condition 1 is for the case the transmission signal type is "control signal", and a condition 2 is for the case of "phone call/data transmission". In the present exemplary embodiment, it is assumed that the control signal (condition 1) is lower in average power compared to the phone call/data transmission (condition 2), and is transmitted intermittently. In addition, parameters of the quantizer (threshold values and output values) for the condition 1 are described using FIG. 4(c).

As shown in Table 1, for the conditions 1 and 2, the multiplication coefficients (α, β) and output values of the quantizer are common (that is, they are fixed), and the threshold values of the quantizer are different between them (that is, they are variable). Accordingly, in processing based on Table 1, only "threshold values" of the quantizer provided in the Δ-Σ modulator 201 are variable between the conditions 1 and 2.

The parameter controller 202 comprises a reference table (not shown in FIGS. 5 and 6). In the present exemplary embodiment, it is supposed that the contents in Table 1 are stored in the reference table. The parameter controller 202 receives change-timing information including the content of a change (may be a transmission signal type, or also may be a condition itself) from the upper level device 302. Hereinafter, the case of the content of a change being the transmission signal type is taken as an example. The parameter controller 202 extracts a transmission signal type, searches the reference table using the extracted transmission signal type as a key, and acquires parameters corresponding to a hit transmission signal type (in the present exemplary embodiment, at least threshold values of the quantizer which is subjected to the change). The parameter controller 202 changes threshold values of the quantizer of the Δ-Σ modulator 201 to the threshold values acquired from the reference table. That is, parameters of the Δ-Σ modulator 201 constituting the transmitter 301 (in the present exemplary embodiment, threshold values of the quantizer) are changed in synchronization with reception of change-timing information from the upper level device 302.

Here, if the number of conditions to switch is two, as in Table 1, the change-timing information does not necessarily need to include the content of the change. That is, it is possible to perform a kind of control where a currently set state (for example, the state where parameters of the condition 1 are set) is automatically switched to the other state (for example, the state where parameters of the condition 2 are set) on every inputting of change-timing information. In this way, respective processing loads of the upper level device 302 and of the transmitter 301 can be reduced, and a communication load between them is also reduced.

Figure 7:
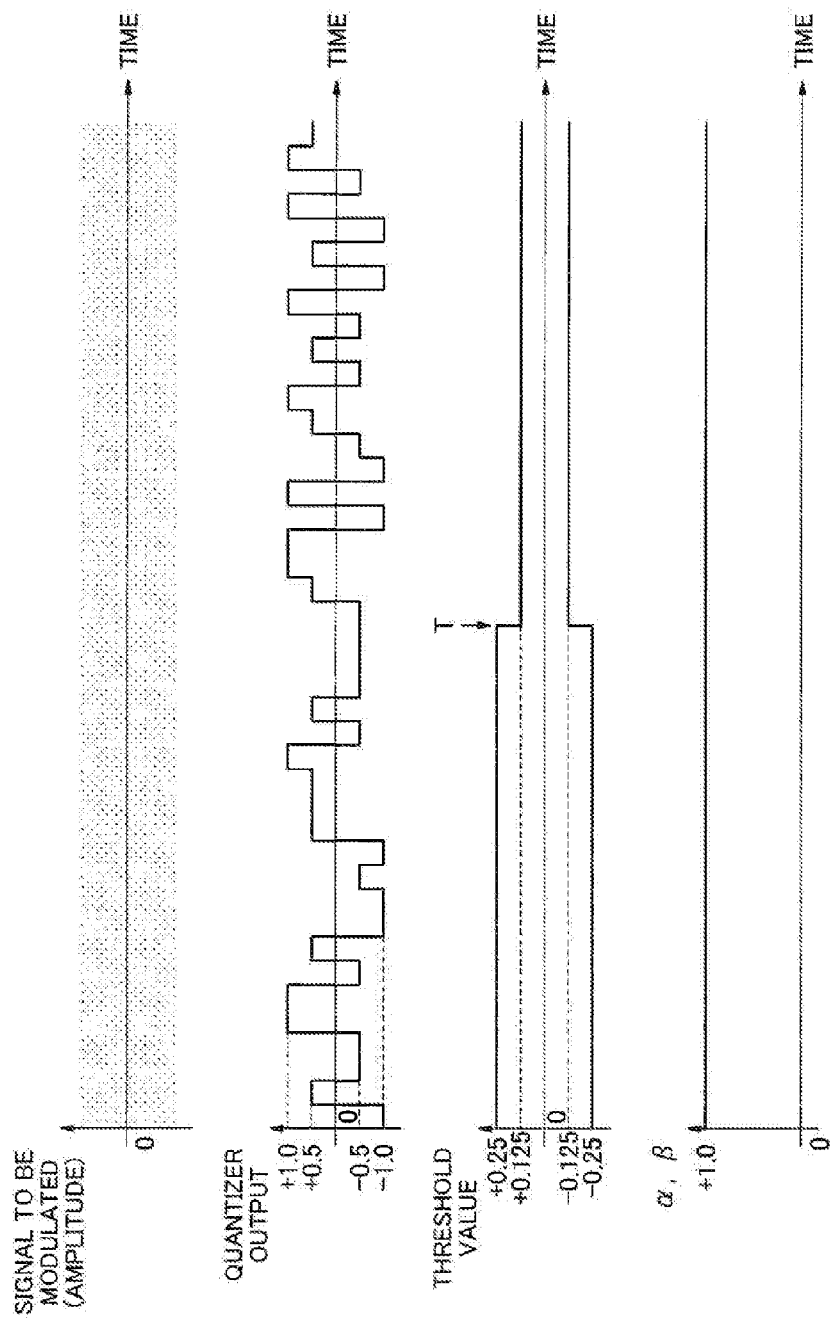
FIG. 7 A timing chart for when, in the transmitter shown in FIG. 5, threshold values of a quantizer of a Δ-Σ modulator are changed from values of a condition 1 to that of a condition 2, in response to a change of transmission signal type.

FIG. 7 shows a timing chart for when, in the transmitter 301, threshold values of the quantizer of the Δ-Σ modulator 201 are changed from the values according to the condition 1 to that according to the condition 2, in response to the change of transmission signal type. In this case, in accordance with the description in Table 1, the multiplication coefficients (α, β) and the output values of the quantizer are assumed to be kept constant even when a condition is switched. It is assumed that, at a time point T, the transmission signal is changed from "control signal" to "phone call/data transmission". At the time point T, the upper level device 302 notifies the transmitter 301 of change-timing information including a transmission signal type (in this case, "phone call/data transmission"). The parameter controller 202 extracts the transmission signal type, searches the reference table using the extracted transmission signal type as a key, and acquires the threshold values (±0.125, 0) of the condition 2 which is hit in the search. The parameter controller 202 replaces the current threshold values (±0.25, 0/threshold values of the condition 1) of the quantizer of the Δ-Σ modulator 201 by the acquired threshold values. As recognized from FIG. 7, the threshold values are changed from that of the condition 1 to that of the condition 2 at the time point T. Here, in FIG. 7, as described above, the multiplication coefficients (α, β) do not change at the time point T, and are thus kept constant, the output values of the quantizer are still in four levels (however, even for an identical input value, the output content differs between before and after the time point T in accordance with the change of the threshold values).

Figure 8:
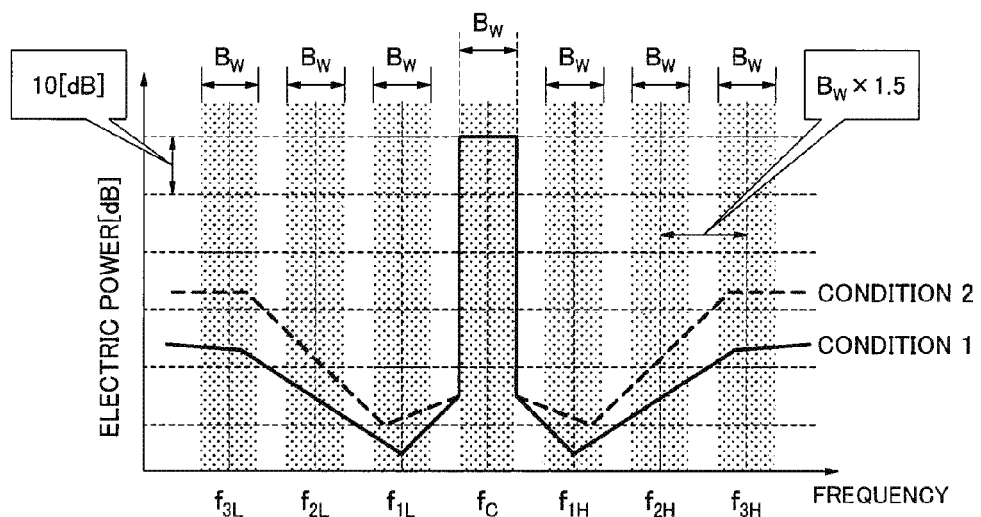
FIG. 8 Transmission signal spectra for respective transmission signal types are shown, specifically, (a) shows a transmission signal spectrum for each of the conditions 1 and 2 for the case the transmission signal type is "control signal", and (b) shows that for the case the transmission signal type is "phone call/data transmission".
Figure 8:
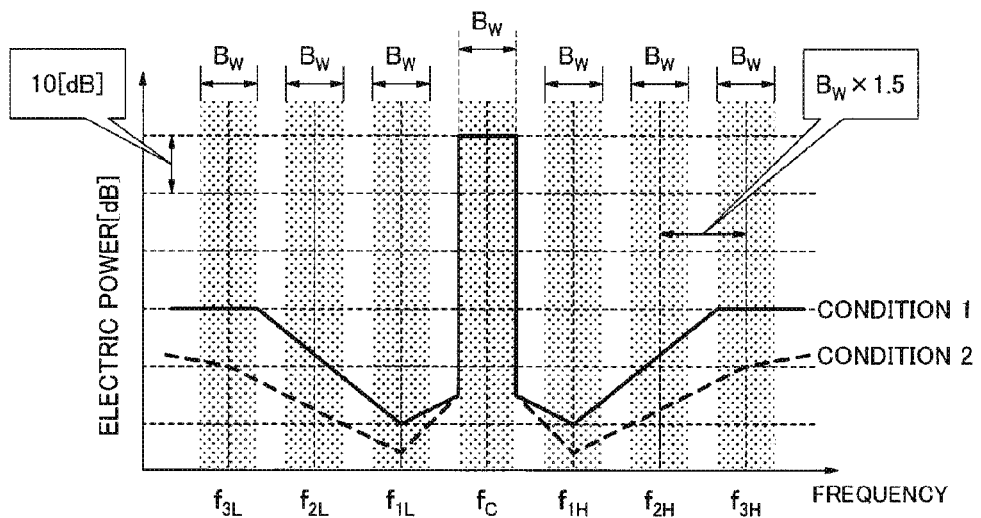

FIG. 8 shows transmission signal spectra for the respective transmission signal types. Specifically, FIG. 8 (a) shows a transmission signal spectrum for each of the conditions 1 and 2 (refer to Table 1 for both) in the case the transmission signal type is "control signal". In FIG. 8 (a), a transmission signal spectrum under the condition 1 is expressed by a solid line, and that under the condition 2 is by a dashed line. FIG. 8 (b) shows a transmission signal spectrum for each of the conditions 1 and 2 (refer to Table 1 for both) in the case the transmission signal type is "phone call/data transmission". In FIG. 8 (b), the transmission signal spectrum under the condition 1 is expressed by a solid line, and that under the condition 2 is by a dashed line.

In FIGS. 8(a) and 8(b), Bw is a band of a transmission signal, fc is the center frequency of the transmission signal, and f1H, f2H, f3H, f1L, f2L and f3L are the center frequencies of respective ones of six frequency bands on which ACPR is calculated (electric power is measured). In FIGS. 8(a) and 8(b), the above-mentioned six frequency bands are shown by hatching, and their bandwidth is Bw. In FIGS. 8(a) and 8(b), the unit and actual values of the abscissa are omitted.

A method of calculating the center frequencies of respective ones of six frequency bands on which ACPR is calculated, f1H, f2H, f3H, f1L, f2L and f3L, may be, for example, as follows.

$$f1H = fc + (Bw \times 1.5 \times 1)$$

$$f2H = fc + (Bw \times 1.5 \times 2)$$

$$f3H = fc + (Bw \times 1.5 \times 3)$$

$$f1L = fc - (Bw \times 1.5 \times 1)$$

$$f2L = fc - (Bw \times 1.5 \times 2)$$

$$f3L = fc - (Bw \times 1.5 \times 3)$$

In Table 2, shown is an example of ACPR calculated by the above-described method.

TABLE 2

Example of ACPR

| | f3L | f2L | f1L | f1H | f2H | f3H | note |
|---|---|---|---|---|---|---|---|
| standard [dBc] | −35 | −40 | −50 | −50 | −40 | −35 | — |
| Control signal | −38 | −45 | −53 | −53 | −45 | −38 | condition 1 [dBc] |
| | −28 | −36 | −48 | −48 | −36 | −28 | condition 2 [dBc] |
| phone call/data transmission | −30 | −37 | −48 | −48 | −37 | −30 | condition 1 [dBc] |
| | −40 | −47 | −53 | −53 | −47 | −40 | condition 2 [dBc] |

As recognized from Table 2, when the transmission signal type is "control signal", the condition 1 gives higher ACPR values than the condition 2, and further, the values satisfy the standards. On the other hand, when the transmission signal type is "phone call/data transmission", the condition 2 gives higher ACPR values than the condition 1, and further, the values satisfy the standards. Accordingly, the best ACPR values can be obtained if the condition 1 is used in the case of the transmission signal type being "control signal" and the condition 2 is used in the case of the transmission signal type being "phone call/data transmission". In the present exemplary embodiment, adaptive control is performed so as to realize that way. That is, when the transmission signal type is changed from "phone call/data transmission" to "control signal", the parameters of the Δ-Σ modulator 201 are changed from that of the condition 2 to that of the condition 1.

According to the first exemplary embodiment described above, since the parameter controller 202 changes the parameters of the Δ-Σ modulator 201 (multiplication coefficients (α, β), threshold values or output values of the quantizer) on the basis of a condition or a situation at that time, signal and noise transfer functions of the Δ-Σ modulator are not fixed to be a certain one. That is, for example, it is possible for the Δ-Σ modulator to adapt to temporal change or the like in a transmission situation (transmission signal type, modulation method, transmission power or the like), and thus, the best or better ACPR values are always obtained. As a result, it becomes possible to improve radio characteristics of the transmitter 301.

Here, in the first exemplary embodiment described above, the control information transmitted from an external device such as an upper level device is not limited to a transmission signal type. Also, the transmission signal type is not limited to the control signal or the phone call/data transmission.

Further, the number of conditions and values of various parameters can be set optionally. However, in relation to the various parameters, there may be a case where an absolute value of data stored in a delay device of the Δ-Σ modulator becomes very large or a case where operation of the Δ-Σ modulator becomes unstable as a result of repeating a change between a very large value and a small value close to zero. Accordingly, it is desirable practically to set values of various parameters so that data stored in the delay device transits within a certain range.

Further, there is no restriction on timing of changing the parameters. For example, the parameters may be changed at predetermined timing such as the time of power-on or of resetting, or may be changed on every change in a condition or a situation by regularly monitoring the change. Further, a trigger time of a parameter change is optional. For example, it may be synchronized with change-timing information from the upper level device, and may also be determined to be the timing which is set by the parameter controller 202 itself on the basis the change-timing. Alternatively, if the parameter controller 202 itself can detect power-on, resetting or change in a situation, it can change the parameters also by its self-decision without being based on an order from the upper level device.

Further, the parameter controller 202 can be realized either by hardware or by software. When the parameter controller 202 is realized by software, the transmitter 301 comprises a computer circuit (for example, a CPU (Central Processing Unit)). The computer circuit executes a parameter control program which is stored in a recording medium (for example, a ROM (Read Only Memory), a hard disk or the like) provided in the transmitter 301 or in an external recording medium (for example, a removable medium, a removable disk or the like).

Further, a method for determining a replacement value of a parameter is not limited to that of determining it with reference to a reference table or the like in accordance with a condition for which adaptive control is performed as described above. For example, a replacement value may be determined by calculation in accordance with a condition. Also, it is possible to determine a replacement value by performing also calculation while referring to a reference table in accordance with a condition. Further, it is also possible to revise a reference table appropriately by calculation.

As examples of conditions for the adaptive control, those other than the above-described one are listed below. Of course, conditions for which the adaptive control is to be performed are not limited to these ones. It is also possible to perform the adaptive control by combining a plurality of conditions.

When a plurality of back-off request values to the signal amplifier exist in terms of transmission signal types or average power, adaptive control is performed by setting, for each of the back-off request values, multiplication coefficients of the Δ-Σ modulator or the threshold values and the output values of the quantizer at values giving the best radio characteristics, and changing them in accordance with the back-off request values.

Adaptive control is performed by setting, for each modulation method of a transmission signal, multiplication coefficients of the Δ-Σ modulator or the threshold values and the output values of the quantizer at values giving the best radio characteristics, and changing them in accordance with the modulation method of a signal being sent currently.

Adaptive control is performed by setting the multiplication coefficients of the Δ-Σ modulator or the threshold values and the output values of the quantizer at values giving the best radio characteristics, on the basis of a magnitude of transmission power or ACPR values measured at the transmitter, or of SIR (Signal to Interference Ratio) values or the like measured at a receiving side, and changing them in accordance with the above-mentioned measurement values. The magnitude of transmission power measured by the transmitter relates to an average value of input of the Δ-Σ modulator, and this value also can be set as the threshold value of the quantizer.

Because a load of the transmitter changes with time slots, such as morning/daytime/night/midnight, day of week and a national holiday, adaptive control is performed by setting, for each time slot, the multiplication coefficients of the Δ-Σ modulator or the threshold values and the output values of the quantizer at values giving the best radio characteristics, and changing them in accordance with a time slot.

Adaptive control is performed by setting the multiplication coefficients of the Δ-Σ modulator or the threshold values and the output values of the quantizer at values giving the best radio characteristics, in accordance with the efficiency of a signal amplifier constituting the transmitter, for example, for each of the case the efficiency is emphasized and other cases, and changing them in accordance with currently demanded efficiency of the signal amplifier.

An amplitude distribution is analyzed using a certain number of transmission data, and an amplitude value of the highest frequency, for example, is set as a threshold value of the quantizer. The amplitude distribution analysis is performed at a constant time interval or in response to an order from the upper level device, and the threshold value is updated on every analysis.

In a time-division transmission, there exists a time slot where transmission signal power becomes zero, but in the case of a transmitter using EDSM, noise having undergone shaping is transmitted even in a time slot of a null signal. Adaptive control is performed by setting the parameters of the Δ-Σ modulator at values reducing noise power in a null signal time slot, and changing them between in the ordinary transmission and in the null signal time slot.

Second Exemplary Embodiment

In the first exemplary embodiment, the case of arranging the parameter controller 202 outside the Δ-Σ modulator 201 is exemplified, but it is also possible to install the function of the parameter controller 202 inside a Δ-Σ modulator.

Figure 9:
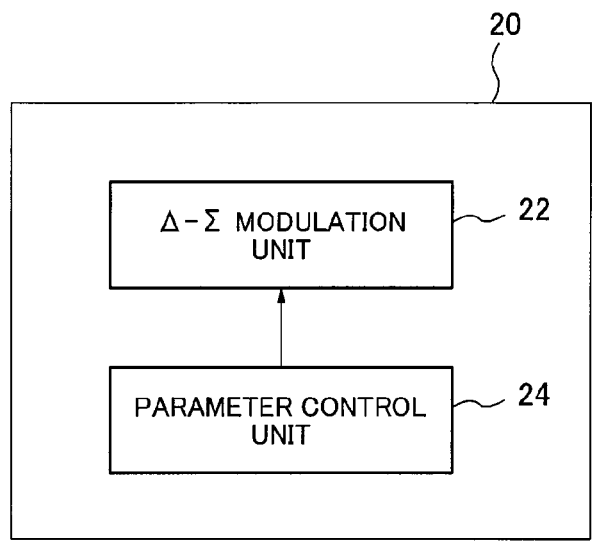
FIG. 9 A block diagram showing an example of a configuration of a Δ-Σ modulator comprising a built-in parameter control function according to a second exemplary embodiment of the present invention.

FIG. 9 is a diagram showing an example of a configuration of a Δ-Σ modulator 20 according to a second exemplary embodiment, which comprises a built-in parameter control function. Here, the Δ-Σ modulator 20 is embodied, for example, in the form of a one chip LSI (Large Scale Integration). The Δ-Σ modulator 20 comprises a Δ-Σ modulation unit 22 and a parameter control unit 24. The Δ-Σ modulation unit 22 has the same configuration as that of the Δ-Σ modulator 201 shown in FIG. 5. That is, the Δ-Σ modulation unit 22 does not operate with fixed parameters, but can perform modulation processing on the basis of inputted parameters. The parameter control unit 24 has the same configuration as that of the parameter controller 202 shown in FIG. 5. Operation of the Δ-Σ modulator 20 is the same as that described in the first exemplary embodiment.

As has been described above, by configuring such that the function of the parameter controller 202 is installed inside the Δ-Σ modulator, it becomes possible to simplify the circuit configuration of the transmitter and further to reduce a space for mounting the components.

Third Exemplary Embodiment

A third exemplary embodiment is characterized by that, in order to change various parameters of a Δ-Σ modulator stably, a gap section for parameter changing is provided in a transmission signal, and various parameters of the Δ-Σ modulator are changed during the gap section. Here, no meaningful signal is included in the gap section. Accordingly, a signal in the gap section may be indefinite or may be fixed at a predetermined value (for example, zero). The difference of the third exemplary embodiment from the first exemplary embodiment exists in operation. Accordingly, hereinafter, description may be given using the configuration of the first exemplary embodiment.

Figure 10:
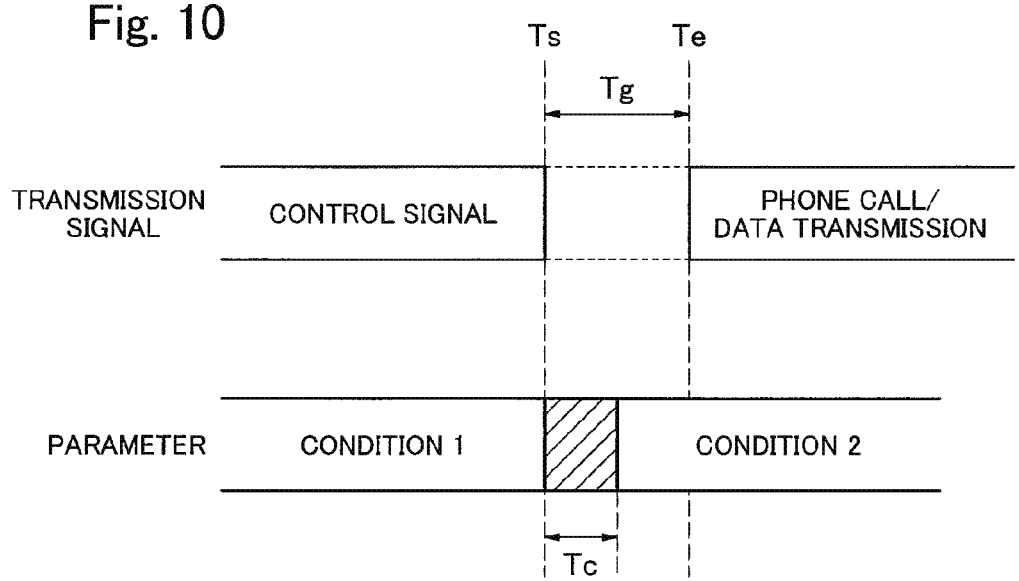
FIG. 10 A timing chart for illustrating operation of a third exemplary embodiment of the present invention.

FIG. 10 is a timing chart for illustrating operation of the third exemplary embodiment of the present invention. It is supposed that, at a time point Ts, for example, the upper level device changes the transmission signal type of a transmission signal from "control signal" (refer to the condition 1 in Table 1) to "phone call/data transmission" (refer to the condition 2 in Table 1). At the time point Ts, the upper level device starts a gap period Tg which is a section with no transmission signal outputted (output itself is not meaningful), and sends change-timing information to the transmitter 301 (specifically, the parameter controller 202). This change-timing information includes an instruction to change, on its reception, parameters of the Δ-Σ modulator 201 from that of the condition 1 to that of the condition 2.

The parameter controller 202 having received the change-timing information acquires parameters corresponding to the condition 2 such as, for example, by referring to a reference table. The parameter controller 202 sets the acquired parameters in the Δ-Σ modulator 201, and the parameters are subsequently settled in the Δ-Σ modulator 201.

On the other hand, the upper level device monitors an end of the gap period Tg (a time point Te) and, if detecting the end of the gap period T, it enables a transmission signal to be effective, in other words, it outputs an ordinary meaningful signal. Specifically, in the present case, outputting a transmission signal of "phone call/data transmission" is started.

It is supposed that it takes a certain time period Tc (indefinite parameter period) since the reception of the change-timing information (the time point Ts) until when parameters are settled in the Δ-Σ modulator 201 from reception (time Ts) of change timing information. If a transmission signal is effective in this period Tc, modulation processing is performed using unsettled parameters and thus, decrease in output reliability is anticipated. However, by setting the gap period Tg to be longer than the period Tc, because the modulation processing can be performed certainly after the parameters are settled, the fear of decrease in output reliability is eliminated.

Although a dedicated gap section is provided in the above description, it is not necessarily required. For example, in the case of TDD (Time Division Duplex) method, a receiving time slot is a time slot where no transmission signal exists certainly from system point of view, and hence it can be used as a gap section for parameter changing. Further, in the case of OFDM (Orthogonal Frequency Division Multiplexing), a guard interval is not a time slot with no transmission signal but is a time slot with a discontinuous signal, and hence it can be used as a gap section for parameter changing.

Here, in the present exemplary embodiment, as examples of parameters of the Δ-Σ modulator 201, there can be mentioned multiplication coefficients of a multiplier constituting the Δ-Σ modulator 201, the threshold values and the output values of a quantizer constituting the Δ-Σ modulator 201, and the like.

Fourth Exemplary Embodiment

In the present exemplary embodiment, a way of selecting optimal quantizer parameters in an EDSM transmitter is described.

In an EDSM transmitter shown in FIG. 2, to the Δ-Σ modulator, inputted is an envelope signal of a radio signal detected by the envelope detector. If the radio signal is of a type whose amplitude is also modulated, such as of W-CDMA (Wideband Code Division Multiple Access) and LTE (Long Term Evolution), the envelope signal changes with time.

Figure 11:
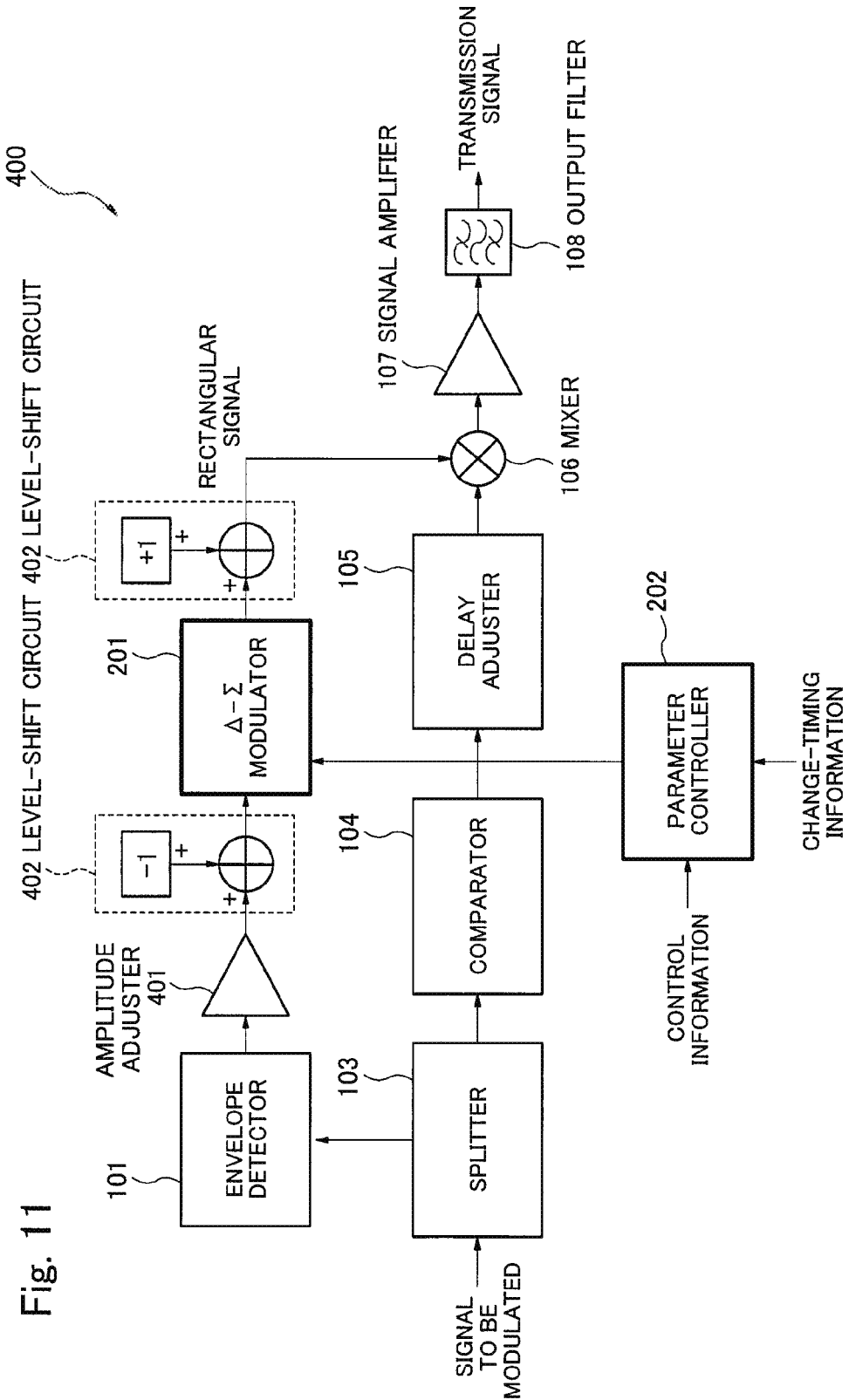
FIG. 11 A block diagram showing an example of a configuration of a transmitter according to a fourth exemplary embodiment of the present invention.

FIG. 11 is a block diagram showing an example of a configuration of a transmitter 400 according to a fourth exemplary embodiment of the present invention. In the transmitter 400, scaling and level-shifting can be performed on the envelope signal before inputting it to the Δ-Σ modulator 201 so that it fits in just proportion within a possible input range of the Δ-Σ modulator 201. The scaling is performed in an amplitude adjuster 401. The level-shifting is performed in a level-shift circuit 402. For example, when the variation range of the envelope signal is from 0 to Vmax and the possible input range of the Δ-Σ modulator 201 is from a to b (b>a is assumed), the envelope signal is multiplied by (b−a)/Vmax, and then the resultant signal is level-shifted by a. By this operation, the variation range of an input signal just before being inputted to the Δ-Σ modulator (hereafter, referred to as an input envelope signal) becomes from a to b. By this operation, it becomes possible to fully utilize the dynamic range that the Δ-Σ modulator 201 can deal with, and thus to suppress at a minimum the influence of quantization noise arising in quantization performed inside the Δ-Σ modulator 201. Here, to the output of the Δ-Σ modulator 201, a value equivalent to the amount of the level-shifting performed at the input side with the sign inverted (=−a) needs to be added.

The average value of an input envelope signal, $V_{envdc}$, is expressed by the following equation 2 using the maximum value Vmax and the temporal average value Vdc of the original envelope signal.

$$V_{envdc} = a + (b-a) \times Vdc/Vmax \quad \text{(equation 2)}$$

Figure 3:
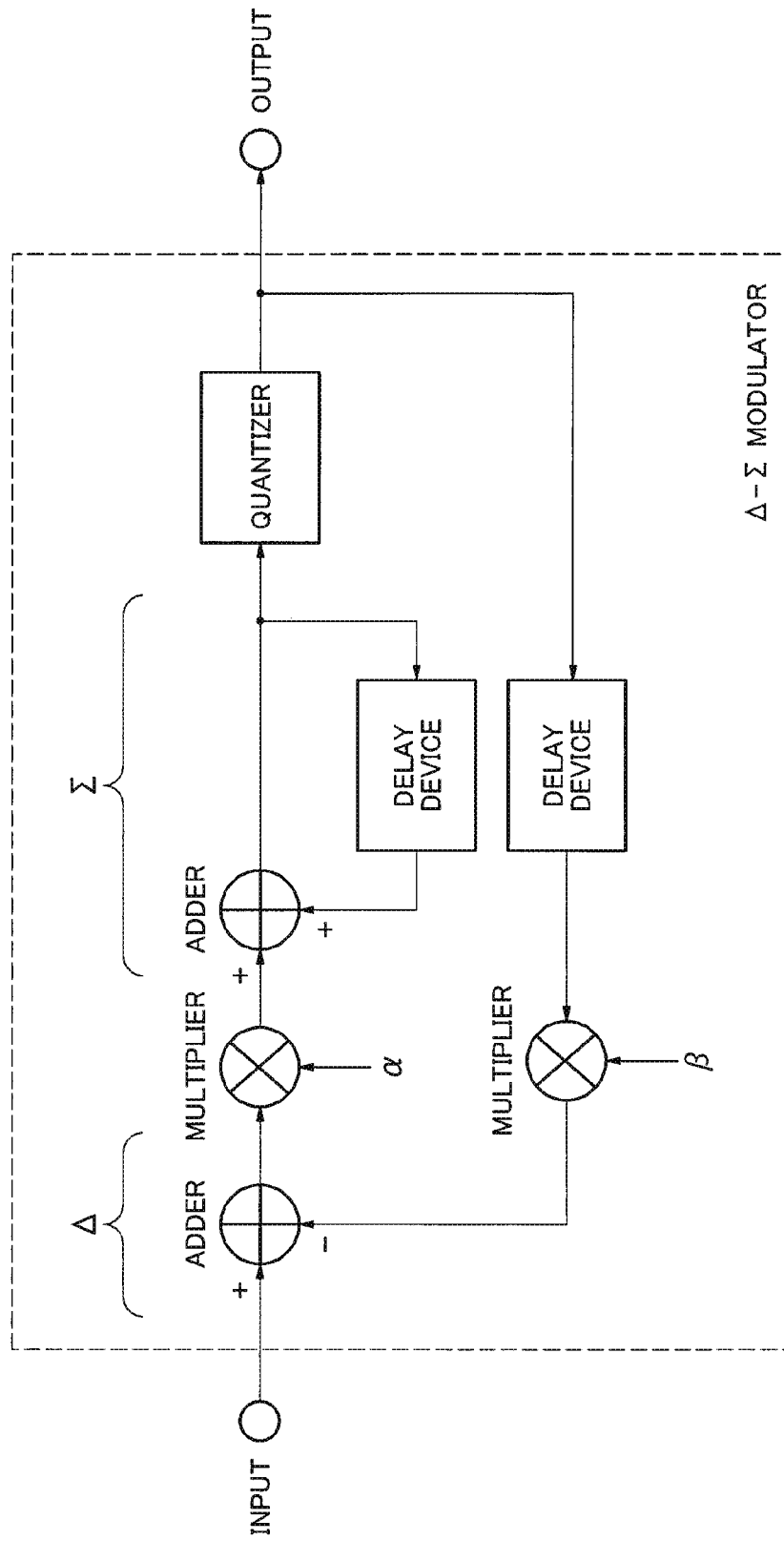
FIG. 3 A circuit configuration diagram of a first-order Δ-Σ modulator.

When multiplication coefficients α and β shown in FIG. 3 are both 1, because the signal transfer function is 1 according to the equation 1, the temporal average value of an output signal of the Δ-Σ modulator 201 coincides with the temporal average value of a corresponding input signal. Accordingly, the temporal average value of an output signal of the Δ-Σ modulator 201 also becomes $V_{envdc}$.

In the following description, a case of assuming a as −1 and b as 1 is taken as a simple example. Among combinations of the threshold values and the output values of the quantizer of the Δ-Σ modulator 201, in the case of a combination whose output values include $V_{envdc}$, such as combination examples 1, 2 and 3 in Table 3, if an input signal value is constantly $V_{envdc}$, a value outputted from the Δ-Σ modulator 201 becomes constantly $V_{envdc}$, and quantization noise thus becomes 0. Even if an input signal value varies with time, when it is highly possible that the signal values exist in the vicinity of $V_{envdc}$, it can be considered that quantization noise is decreased by determining output values to include $V_{envdc}$.

Therefore, it is considered that, in the case of the temporal average value of a signal being $V_{envdc}$, when the output values of the Δ-Σ modulator 201 include $V_{envdc}$, a quantization noise reduction effect is obtained.

TABLE 3

Examples of Δ-Σ modulator parameters 2

| | multiplication coefficient (α, β) | quantizer threshold values | output |
|---|---|---|---|
| combination example 1 | 1.0 | (arbitrary value between −1 and $V_{envdc}$), (arbitrary value between 1 and $V_{envdc}$) | ±1.0, $V_{envdc}$ |

TABLE 3-continued

Examples of Δ-Σ modulator parameters 2

| | multiplication coefficient (α, β) | quantizer threshold values | output |
|---|---|---|---|
| combination example 2 | 1.0 | (arbitrary value between −1 and $V_{envdc}$), (arbitrary value between $V_{envdc}$ and 0), (arbitrary value between 0 and 1) | ±1, $V_{envdc}$ 0 ($V_{envdc}$ is equal to or smaller than 0) |
| combination example 3 | 1.0 | (arbitrary value between −1 and 0), (arbitrary value between 0 and $V_{envdc}$), (arbitrary value between $V_{envdc}$ and 1) | ±1, $V_{envdc}$ 0 ($V_{envdc}$ is equal to or larger than 0) |
| combination example 4 | 1.0 | −0.75, 0 | ±1, −0.5 ($V_{envdc}$ is −0.47) |

It is further considered that a quantization noise reduction effect is obtained also by selecting, as an output value of the Δ-Σ modulator 201, a value which is closest to $V_{envdc}$ among values easy to adopt, even if not selecting $V_{envdc}$ itself. For example, when $V_{envdc}$ takes a value such as −0.47, a configuration including −0.5 as an output value can be considered, as the combination example 4 in Table 3. Here, the value −0.5 is one of five boundary values of when the range between the maximum (=1) and the minimum (=−1) of output values of the Δ-Σ modulator is equally divided into four parts (that is, (−1), (−0.5), (0), (0.5), (1)). By thus setting as an output value a boundary value obtained by dividing the output value range by an integer number, a load of digital data processing can be reduced.

Among configurations of EDSM, the configuration shown in FIG. 2 does not have a scaling means (the amplitude adjuster 401) and the level-shift circuit 402 at the input and output sides, respectively, of the Δ-Σ modulator, and hence the temporal average value of an input envelope signal, $V_{envdc}$, is equal to the temporal average value of a corresponding envelope signal, Vdc. Also in this case, it is considered that an equalization noise reduction effect is obtained by determining output values of the Δ-Σ modulator to include $V_{envdc}$. Further, also in this case, it is considered that, similarly to the case of FIG. 11, an equalization noise reduction effect is obtained also by selecting, as an output value of the Δ-Σ modulator, a value which is closest to $V_{envdc}$ among values easy to adopt, even if not selecting $V_{envdc}$ itself.

That is, in terms of the whole transmitter, by changing the threshold values and the output values of the quantizer to those giving an effect of quantization noise reduction as those of the above-described combination examples 1-4, on the basis of the temporal average value of the envelope of a signal desired to be transmitted, it is possible to always generate an RF-band radio signal with the influence of quantization noise suppressed at a minimum.

In the first to the fourth exemplary embodiments described above, although some measures are needed in terms of hardware, it is also possible to perform adaptive control on the number of output bits of the Δ-Σ modulator.

The Δ-Σ modulator is not limited to the first-order Δ-Σ modulator described in the background art section, and the present invention can be applied also to a Δ-Σ modulator of second or higher order or that of a multi-stage type such as a cascade and MASH (Multi-stAge noise SHaping) ones.

Figure 1:
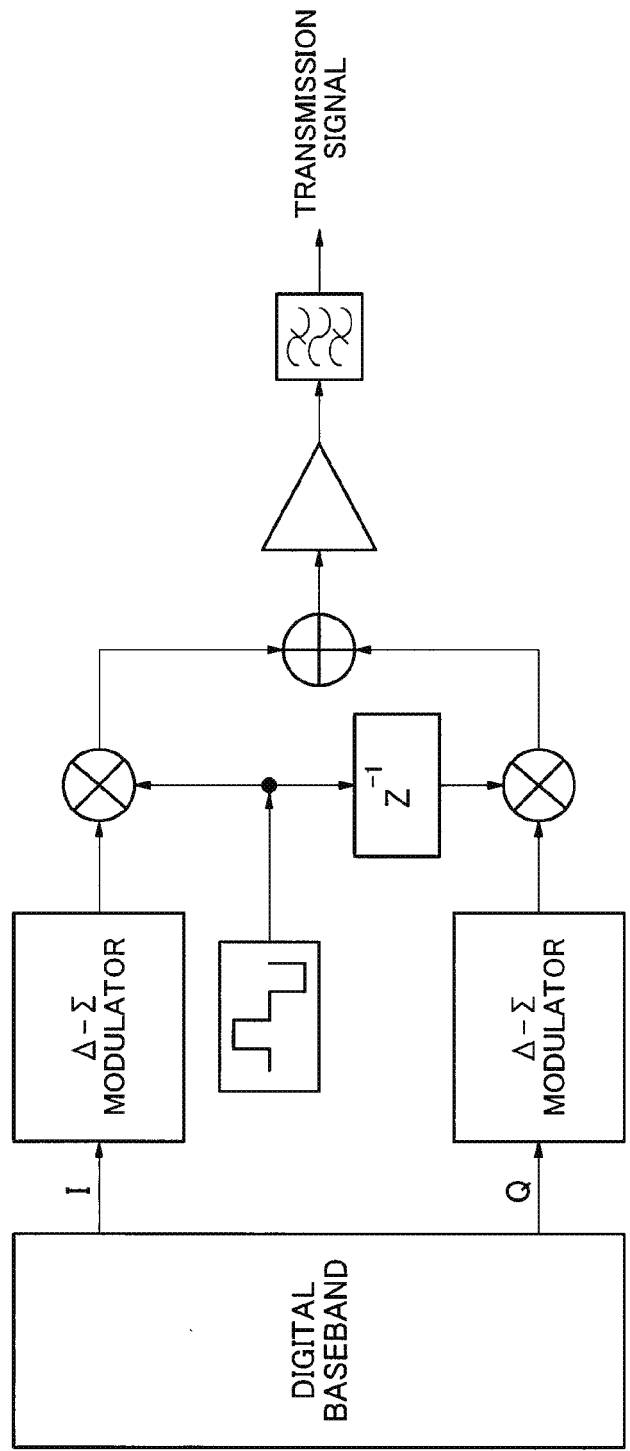
FIG. 1 A block diagram showing an example of a configuration of a transmitter using IF-DSM.

Further, although, in the first to the fourth exemplary embodiments described above, description has been given of means of changing various parameters of a Δ-Σ modulator aiming at improving radio characteristics of a transmitter in an EDSM configuration, the parameter changing means can be employed also in the IF-DSM configuration shown in FIG. 1.

Fifth Exemplary Embodiment

Figure 12:
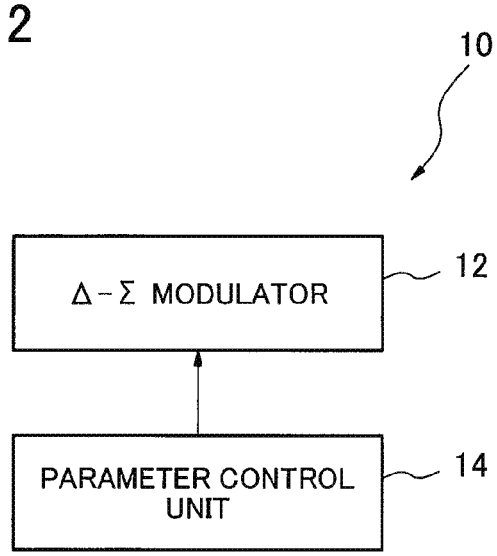
FIG. 12 A block diagram showing an example of a configuration of a transmitter according to a fifth exemplary embodiment of the present invention.

FIG. 12 is a block diagram showing an example of a configuration of a transmitter 10 according to a fifth exemplary embodiment of the present invention.

The transmitter 10 comprises a Δ-Σ modulator 12 and a parameter control unit 14. The parameter control unit 14 changes parameters of the Δ-Σ modulator 12 in accordance with a predetermined condition. Here, as examples of predetermined conditions, there can be mentioned the type or modulation method of a transmission signal, the magnitude of transmission power and ACPR values measured by the transmitter 10, reception of an order of parameter changing from an upper level device, or the like. On the other hand, as examples of parameters of the Δ-Σ modulator 12, there can be mentioned multiplication coefficients of a multiplier constituting the Δ-Σ modulator 12, the threshold values and the output values of a quantizer constituting the Δ-Σ modulator 12, and the like. The above-described plurality of parameters may be changed simultaneously, or only any one of the parameters may be changed.

According to the fifth exemplary embodiment described above, since the parameter control unit 14 changes parameters of the Δ-Σ modulator 12 on the basis of a condition or a situation at that time, signal and noise transfer functions of the Δ-Σ modulator are not fixed to be a certain one. That is, it is possible for the Δ-Σ modulator to adapt to temporal change or the like in a transmission situation (transmission signal type, modulation method, transmission power or the like), and thus, the best or better ACPR values are always obtained. As a result, radio characteristics of the transmitter 10 can be improved.

Although the present invention has been described above with reference to exemplary embodiments, the present invention is not limited to the above-described exemplary embodiments. In configurations and details of the present invention, various changes which are understood by those skilled in the art can be made within the scope of the present invention.

The invention claimed is:
1. A transmitter comprising:
a Δ-Σ modulation means which performs Δ-Σ modulation of a predetermined input signal; and
a control means which changes a parameter of said Δ-Σ modulation means in accordance with a predetermined condition, wherein said Δ-Σ modulation means performs Δ-Σ modulation of an envelope signal generated at a baseband extracted from an orthogonal radio signal, said Δ-Σ modulation means includes an adding means and a quantization means, said quantization means outputs three or more output values which correspond to the results of comparison between two or more threshold values and an input of said quantization means, a signal inputted to said Δ-Σ modulation means is inputted to said adding means, a signal outputted from said quantization means, after a predetermined signal processing, which includes a signal processing provided by said adding means, is fed back to said quantization means, said signal outputted from said quantization means is outputted from said Δ-Σ modulation means, said parameter is at least one of a threshold value of a quantization means constituting said Δ-Σ modulation means and an output value of said quantization means, said predetermined condition is at least one of a transmission signal type of said input signal, a back-off request value to an amplification means constituting said transmitter, a modulation method of said input signal, a magnitude of transmission power measured by said transmitter, a time slot of transmission, amplitude distribution of said input signal, and a result of identifying whether a null signal or not, said control means changes said parameter for improving radio characteristics based on ACPR (Adjusted Channel Leakage Power Radio) measured by said transmitter, and SIR (Signal to interference Ratio) measured at a receiving side, and efficiency of said amplification means, and said control means selects one output value other than a maximum output value and a minimum output value from among said three or more output values and sets said one output value to the closest possible value to a time average value of said envelope signal.

2. The transmitter according to claim 1, further comprising a multiplication means, wherein said parameters is a multiplication coefficient of a multiplication means.

3. The transmitter according to claim 1, wherein, a possible value as an output value of said quantization means is one of the boundary values of equally divided ranges between a maximum and a minimum output values by an integer number.

4. The transmitter according to claim 1, wherein said input signal comprises a gap section of a predetermined duration which includes no meaningful signal, and said control means changes said parameter during said gap section.

5. A control method of a Δ-Σ modulator for performing Δ-Σ modulation of a predetermined input signal, the Δ-Σ modulator including an adding means and a quantization means, the control method comprising:

performing Δ-Σ modulation of an envelope signal generated at a baseband extracted from an orthogonal radio signal;

inputting a signal inputted to said Δ-Σ modulator to said adding means;

feeding back a signal outputted from said quantization means, after a predetermined signal processing, which includes a signal processing provided by said adding means, to said quantization means;

outputs three or more output values which correspond to the results of comparison between two or more threshold values and an input of said quantization means, from said quantization means;

outputting said signal outputted from said quantization means from said Δ-Σ modulator;

changing a parameter of the Δ-Σ modulator in accordance with a predetermined condition;

changing said parameter for improving radio characteristics based on ACPR (Adjusted Channel Leakage Power Radio) measured by said transmitter, and SIR (Signal to Interference Ratio) measured at a receiving side and efficiency of said amplification means; and selecting one output value other that a maximum output value and a minimum output value from among said three or more output values and setting said one output value to the closest possible value to a time average value of said envelope signal, wherein said parameter is at least one of a threshold value of a quantization means constituting said Δ-Σ modulation means and an output value of said quantization means, and said predetermined condition is at least one of a transmission signal type of said input signal, a back-off request value to an amplification means constituting said transmitter, a modulation method of said input signal, a magnitude of transmission power measured by said transmitter, a time slot of transmission, amplitude distribution of said input signal, and a result of identifying whether a null signal or not.

6. A non-transitory computer readable medium storing a program, causing a computer of a transmitter including a Δ-Σ modulator to execute a control process for performing Δ-Σ modulation of a predetermined input signal, the Δ-Σ modulator including an adding means and a quantization means, the control process comprising:

performing Δ-Σ modulation of an envelope signal generated at a baseband extracted from an orthogonal radio signal;

inputting a signal inputted to said Δ-Σ modulator to said adding means;

feeding back a signal outputted from said quantization means, after a predetermined signal processing, which includes a signal processing provided by said adding means, to said quantization means;

outputs three or more output values which correspond to the results of comparison between two or more threshold values and an input of said quantization means, from said quantization means;

outputting said signal outputted from said quantization means from said Δ-Σ modulator;

changing a parameter of the Δ-Σ modulator in accordance with a predetermined condition;

changing said parameter for improving radio characteristics based on ACPR (Adjusted Channel Leakage Power Radio) measured by said transmitter, and SIR (Signal to Interference Ratio) measured at a receiving side, and efficiency of said amplification means; and selecting one output value other than a maximum output value and a minimum output value from among said three or more output values and setting said one output value to the closest possible value to a time average value of said envelope signal, wherein said parameter is at least one of a threshold value of a quantization means constituting said Δ-Σ modulation means and an output value of said quantization means, and said predetermined condition is at least one of a transmission signal type of said input signal, a back-off request value to an amplification means constituting said transmitter, a modulation method of said input signal, a magnitude of transmission power measured by said transmitter, a time slot of transmission, amplitude distribution of said input signal, and a result of identifying whether a null signal or not.

7. A Δ-Σ modulator comprising:
a Δ-Σ modulation means which performs Δ-Σ modulation of a predetermined input signal; and
a control means which changes a parameter of said Δ-Σ modulation means in accordance with a predetermined condition, wherein
    said Δ-Σ modulation means performs Δ-Σ modulation of an envelope signal generated at a baseband extracted from an orthogonal radio signal,
said Δ-Σ modulation means includes an adding means and a quantization means,
    said quantization means outputs three or more output values which correspond to the results of comparison between two or more threshold values and an input of said quantization means,
a signal inputted to said Δ-Σ modulation means is inputted to said adding means,
a signal outputted from said quantization means, after a predetermined signal processing, which includes a signal processing provided by said adding means, is fed back to said quantization means,
said signal outputted from said quantization means is outputted from said Δ-Σ modulation means,
said parameter is at least one of a threshold value of a quantization means constituting said Δ-Σ means and an output value of said quantization means,
said predetermined condition is at least one of a transmission signal type of said input signal, a back-off request value to an amplification means constituting said transmitter, a modulation method of said input signal, a magnitude of transmission power measured by said transmitter, a time slot of transmission, amplitude distribution of said input signal, and a result of identifying whether a null signal or not,
said control means changes said parameter for improving radio characteristics based on ACPR (Adjusted Channel Leakage Power Radio) measured by said transmitter, and SIR (Signal to Interference Ratio) measured at a receiving side, and efficiency of said amplification means, and
said control means selects one output value other than a maximum output value and a minimum output value from among said three or more output values and sets said one output value to the closest possible value to a time average value of said envelope signal.

* * * * *

UNITED STATES PATENT AND TRADEMARK OFFICE
CERTIFICATE OF CORRECTION

PATENT NO. : 8,873,611 B2  
APPLICATION NO. : 13/821877  
DATED : October 28, 2014  
INVENTOR(S) : Shinichi Hori, Toshio Hayashi and Daisuke Nagai Page 1 of 1

It is certified that error appears in the above-identified patent and that said Letters Patent is hereby corrected as shown below:

In the Claims

Column 16, Line 7: Claim 5, delete "Δ-Σmodulator" and insert -- Δ-Σ modulator --

Column 16, Line 12: Claim 5, delete "side" and insert -- side, --

Column 16, Line 14: Claim 5, delete "that" and insert -- than --

Column 18, Line 6: Claim 7, delete "Δ-Σ" and insert -- Δ-Σ modulator --

Signed and Sealed this  
Thirty-first Day of March, 2015

Michelle K. Lee  
*Director of the United States Patent and Trademark Office*